(12) United States Patent
Lee et al.

(10) Patent No.: US 8,431,983 B2
(45) Date of Patent: Apr. 30, 2013

(54) NON-VOLATILE MEMORY DEVICE AND METHOD OF FABRICATING THE SAME

(75) Inventors: Woong Lee, Seoul (KR); Jung-Yoon Ko, Seoul (KR); Sang-Kyoung Lee, Seoul (KR); Ho-Min Son, Suwon-si (KR); Won-Jun Jang, Seoul (KR); Jung-Geun Jee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 313 days.

(21) Appl. No.: 12/650,367

(22) Filed: Dec. 30, 2009

(65) Prior Publication Data

US 2010/0171166 A1   Jul. 8, 2010

(30) Foreign Application Priority Data

Jan. 5, 2009 (KR) .................. 10-2009-0000438

(51) Int. Cl.
*H01L 29/788* (2006.01)
(52) U.S. Cl.
USPC .. 257/316; 257/321; 257/E29.3; 257/E21.422
(58) Field of Classification Search ........... 257/E29.3, 257/314–321, 396, E29.321, E21.384, E21.419, 257/E29.129, E21.179, E21.68
See application file for complete search history.

(56) References Cited

U.S. PATENT DOCUMENTS

| | | | |
|---|---|---|---|
| 2004/0016956 A1* | 1/2004 | Choi et al. | 257/315 |
| 2005/0085054 A1* | 4/2005 | Chakravarti et al. | 438/478 |
| 2006/0244080 A1* | 11/2006 | Chen et al. | 257/408 |
| 2008/0090352 A1* | 4/2008 | Lee et al. | 438/257 |
| 2008/0090354 A1* | 4/2008 | Baek et al. | 438/264 |
| 2008/0173927 A1* | 7/2008 | Sakuma et al. | 257/316 |
| 2009/0134446 A1* | 5/2009 | Sekine et al. | 257/321 |
| 2009/0140319 A1* | 6/2009 | Oh | 257/321 |

FOREIGN PATENT DOCUMENTS

| | | |
|---|---|---|
| KR | 1020050086296 A | 8/2005 |
| KR | 1020070004341 A | 1/2007 |
| KR | 100741272 B1 | 7/2007 |

* cited by examiner

*Primary Examiner* — Matthew Landau
*Assistant Examiner* — Khaja Ahmad
(74) *Attorney, Agent, or Firm* — Myers Bigel Sibley & Sajovec, P.A.

(57) ABSTRACT

A non-volatile memory device and a method of fabricating the same are provided. The method can include disposing an isolation layer on a semiconductor substrate. The isolation layer may protrude from the main surface of the semiconductor substrate and define an active region. In a recess defined by the protrusion of the isolation layer and the active region, a diffusion-retarding poly pattern and a floating gate may be formed in sequence. A control gate may be disposed on the isolation layer to cover the diffusion-retarding poly pattern and the floating gate.

9 Claims, 9 Drawing Sheets

NON-VOLATILE MEMORY DEVICE AND METHOD OF FABRICATING THE SAME

CROSS-REFERENCE TO RELATED APPLICATIONS

This application claims the benefit of priority under 35 U.S.C. §119 from Korean Patent Application No. 10-2009-0000438, filed on. Jan. 5, 2009, the entire contents of which are hereby incorporated herein by reference.

FIELD OF THE INVENTION

Example embodiments relate to the field of semiconductors in general, and more particularly, to diffusion in semiconductors.

BACKGROUND

In general, a flash memory device can be fabricated on a semiconductor substrate with a floating poly gate having N-type conductivity (i.e., an N-type floating gate). The N-type floating gate and the semiconductor substrate may have an insulating layer interposed therebetween. The insulating layer may electrically insulate the floating gate from the semiconductor substrate.

Electrons stored in the N-type floating gate may pass through the electric barrier of the insulating layer and may be lost through the semiconductor substrate while the flash memory device is operating. In order to reduce the loss of the stored electrons, a P-type conductivity floating poly gate (i.e., a P-type floating gate) may be used in the flash memory device. Since electrons stored in the P-type floating gate pass through the band gap of the floating gate and the electric barrier of the insulating layer and contact the semiconductor substrate, fewer electrons may be lost. On the other hand, impurity ions in the P-type floating gate may more readily diffuse into the semiconductor substrate through the insulating layer. For this reason, it may be difficult for the P-type floating gate to have a desired resistance.

Consequently, a P-type floating gate may degrade the performance of a transistor in the non-volatile memory device.

SUMMARY

Example embodiments provide a method of fabricating a non-volatile memory device that can prevent impurity ions from diffusing from a P-type floating gate to a semiconductor substrate.

As means for achieving the above-mentioned purposes, example embodiments provide a non-volatile memory device including a diffusion-retarding poly pattern under a P-type floating gate, and a method of fabricating the same.

Example embodiments are directed to a non-volatile memory device. The non-volatile memory device may include a semiconductor substrate. An isolation layer configured to define an active region may be disposed in the semiconductor substrate. The isolation layer may protrude upward from an upper surface of the active region. A diffusion-retarding poly pattern may be conformally disposed along a recess defined by the protrusion of the isolation layer and the upper surface of the active region. The diffusion-retarding poly pattern may have conductive atoms and barrier atoms retarding diffusion of the conductive atoms.

In example embodiments, the conductive atoms may have P-type conductivity. The barrier atoms may include nitrogen (N), chlorine (Cl), or carbon (C).

In example embodiments, the non-volatile memory device may further include: an insulating layer disposed between the diffusion-retarding poly pattern and the active region; and a floating gate disposed on the diffusion-retarding poly pattern to fill the recess between the isolation layer and the active region. The insulating layer may include silicon oxide, silicon oxynitride, metal oxide, or a combination thereof. The floating gate may be exposed through the diffusion-retarding poly pattern along the active region.

In example embodiments, the non-volatile memory device may further include: an oxide layer disposed on the floating gate, the diffusion-retarding poly pattern and the isolation layer; and a control gate disposed on the oxide layer. The floating gate may have the conductive atoms. The control gate may have N-type conductivity. The oxide layer may include silicon oxide, silicon oxynitride, metal oxide, or a combination thereof.

Other example embodiments are directed to a method of fabricating a non-volatile memory device. The method may include preparing a semiconductor substrate having an active region and an isolation layer. The isolation layer may be disposed around the active region and protrude upward from an upper surface of the active region. The active region and the isolation layer may have a recess interposed therebetween. An insulating layer may be formed on the active region. A diffusion-retarding poly layer may be conformally formed in the recess. The diffusion-retarding poly layer may be formed to a desired thickness on the insulating layer and the isolation layer using a plasma atomic layer deposition technique.

Meanwhile, forming the diffusion-retarding poly layer may include: depositing a first reactive material functioning as silicon seeds on the insulating layer and the isolation layer; applying a purge gas onto the insulating layer and the isolation layer; depositing a second reactive material functioning as a poly layer on the insulating layer and the isolation layer; and repeating the preceding steps until the poly layer becomes the diffusion-retarding poly layer.

In example embodiments, the first reactive material may be formed by converting a first process gas into plasma. And, the first process gas may include one selected from $SiH_4$, $SiH_2Cl_2$, and $SiCl_4$.

In example embodiments, the second reactive material may be formed by converting the first and second process gases into plasma. The second process gas may include one selected from $NH_3$, $N_2O$, $N_2$, and $CH_4$. And, the second reactive material may have a flow rate of the second process gas smaller than that of the first process gas.

In example embodiments, a flow rate of the first process gas of the first reactive material may be smaller than the flow rate of the first process gas of the second reactive material.

In example embodiments, the method may further include: forming a floating gate layer on the isolation layer and the diffusion-retarding poly layer to fill the recess; implanting impurity ions into the floating gate layer; performing an annealing process on the floating gate layer; and planarizing the floating gate layer and the diffusion-retarding poly layer until the isolation layer is exposed, and to form a preliminary floating gate and a preliminary diffusion-retarding poly pattern.

The floating gate layer may have P-type conductivity. The preliminary diffusion-retarding poly pattern and the preliminary floating gate may fill the recess. And, the diffusion-retarding poly pattern may retard diffusion of the impurity ions of the floating gate layer.

In example embodiments, the method may further include: sequentially forming an oxide layer and a control gate layer to cover the preliminary floating gate and the preliminary diffusion-retarding poly pattern; and patterning the control gate layer, the oxide layer, the preliminary floating gate, and the preliminary diffusion-retarding poly pattern, and to form a diffusion-retarding poly pattern, a floating gate, and a control gate.

The diffusion-retarding poly pattern, the floating gate, and the control gate may be formed to expose the isolation layer and the insulating layer. The control gate layer may have N-type conductivity. And, the insulating layer or the oxide layer may include one selected from silicon oxide, silicon oxynitride, metal oxide, and a combination thereof.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
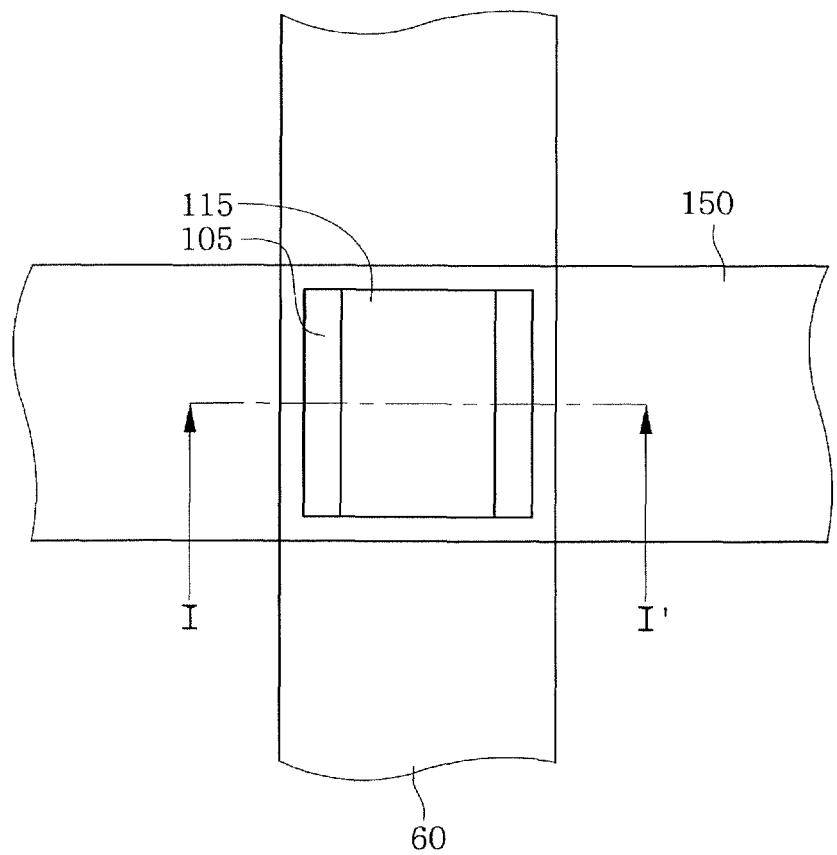
FIG. 1 is a plan view of a non-volatile memory device according to example embodiments.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

As used herein, the term "conductive atoms" or "impurity ions" may be used to describe the resultant of an ion injection process performed in a semiconductor production line. The term "barrier atoms" may be used to describe the resultant of a deposition process performed in a semiconductor production line. Relative terms, such as "under,", "upward," "selective," and "on", may be used to simply describe a relative relationship between a selected component and another component or a shape shown in drawings. Technical terms are used herein not to limit example embodiments but to describe particular aspects only.

Hereinafter, a non-volatile memory device according to example embodiments will be described in detail with reference to FIGS. 1 and 2.

Figure 2:
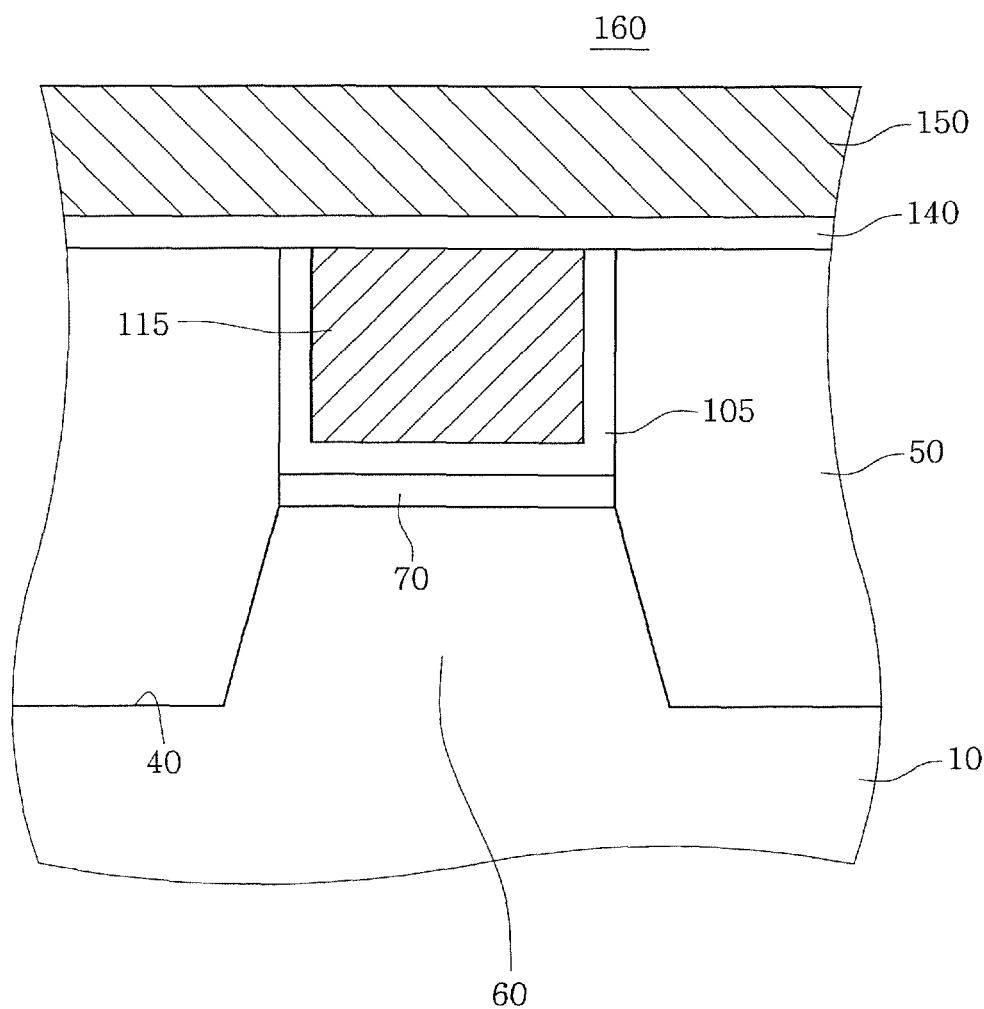
FIG. 2 is a cross-sectional view of a non-volatile memory device taken along line I-I' of FIG. 1.

FIG. 1 is a plan view of a non-volatile memory device according to example embodiments, and FIG. 2 is a cross-sectional view of a non-volatile memory device taken along line I-I' of FIG. 1.

Referring to FIG. 1, example embodiments may define an active region 60. A floating gate 115 may be disposed on the active region 60. The floating gate 115 may be disposed to be electrically isolated from the active region 60. A diffusion-retarding poly pattern 105 may be disposed around the floating gate 115. The diffusion-retarding poly pattern 105 may be disposed on both sides of the floating gate 115 facing each other. A control gate 150 may be disposed on the floating gate 115.

The control gate 150 may be electrically isolated from the floating gate 115. Together with the active region 60 and the floating gate 115, the control gate 150 may constitute a non-volatile memory device 160. The non-volatile memory device 160 may include a NAND or NOR flash memory device.

Referring to FIG. 2, the non-volatile memory device 160 according to example embodiments may include an isolation layer 50 in a semiconductor substrate 10. The isolation layer 50 may define the active region 60 on the semiconductor substrate 10 as shown in FIG. 1. The isolation layer 50 may protrude upward from the upper surface of the active region 60. The isolation layer 50 and the active region 60 may define a recess interposed therebetween. In a predetermined region of the recess between the isolation layer 50 and the active region 60, the diffusion-retarding poly pattern 105 may be disposed. The diffusion-retarding poly pattern 105 may be conformally disposed in the recess.

The diffusion-retarding poly pattern 105 may include conductive atoms. The conductive atoms may impart P-type conductivity to the diffusion-retarding poly pattern 105. In addition to the conductive atoms, the diffusion-retarding poly pattern 105 may include barrier atoms. The barrier atoms may retard diffusion of the conductive atoms in the diffusion-retarding poly pattern 105. The barrier atoms may include nitrogen (N), chlorine (Cl), or carbon (C). The diffusion-retarding poly layer 105 may contact the isolation layer 50, and may be opened along the active region 50 as shown in FIG. 1.

The floating gate 115 may be disposed on the diffusion-retarding poly pattern 105. The floating gate 115 may fill the recess between the isolation layer 50 and the active region 60. The floating gate 115 may include the conductive atoms of the diffusion-retarding poly pattern 105. The floating gate 115 will be referred to as a P-type floating gate below. The P-type floating gate 115 may be surrounded by the diffusion-retarding poly pattern 105 in the recess. The P-type floating gate 115 may be exposed through the diffusion-retarding poly pattern 105 along the active region 60 as shown in FIG. 1.

The control gate 150 may be disposed on the P-type floating gate 115. The control gate 150 may be disposed on the isolation layer 50 to cover the P-type floating gate 115. The control gate 150 may have N-type conductivity. An oxide layer 140 may be disposed between the control gate 150 and the P-type floating gate 115. The oxide layer 140 may be disposed along the control gate 150.

An insulating layer 70 may be disposed between the P-type floating gate 115 and the active region 60. The insulating layer 70 and the oxide layer 140 may include one selected from silicon oxide, silicon oxynitride, metal oxide, and a combination thereof.

A method of fabricating a non-volatile memory device according to example embodiments will be described with reference to FIGS. 3 to 10.

Figure 3:
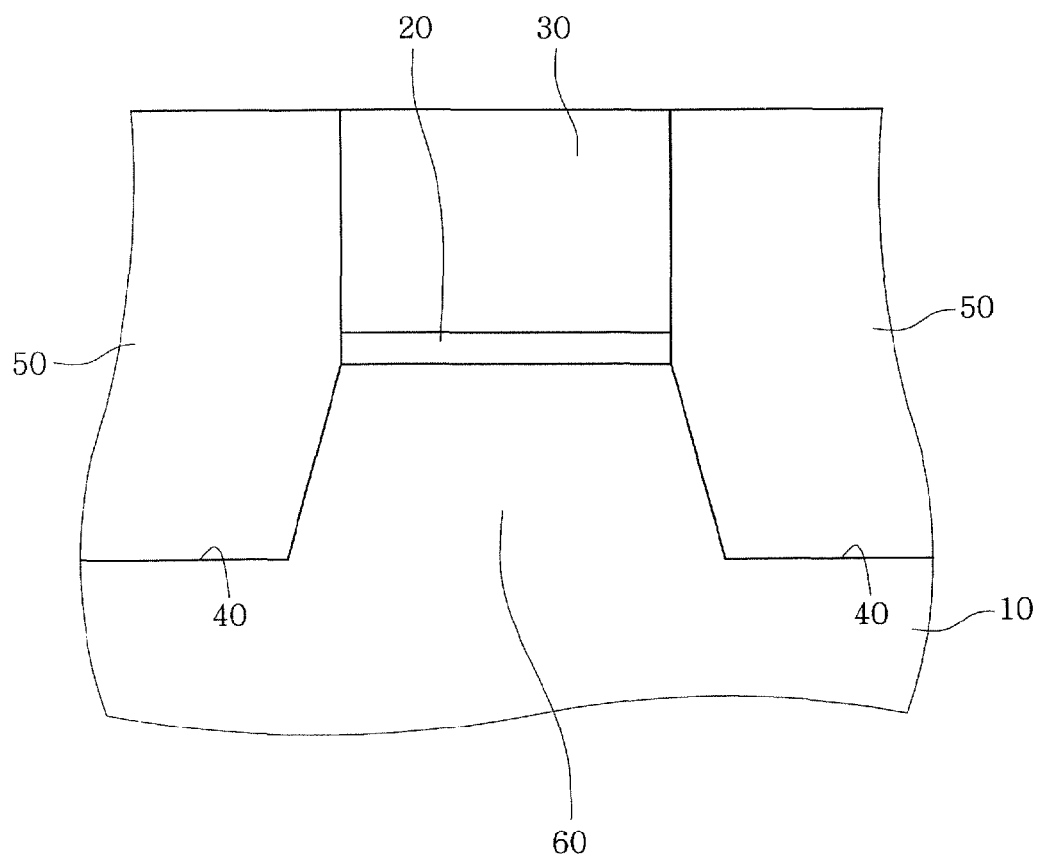
FIGS. 3 to 5 are cross-sectional views taken along line I-I' of FIG. 1, illustrating a method of fabricating a non-volatile memory device.
Figure 4:
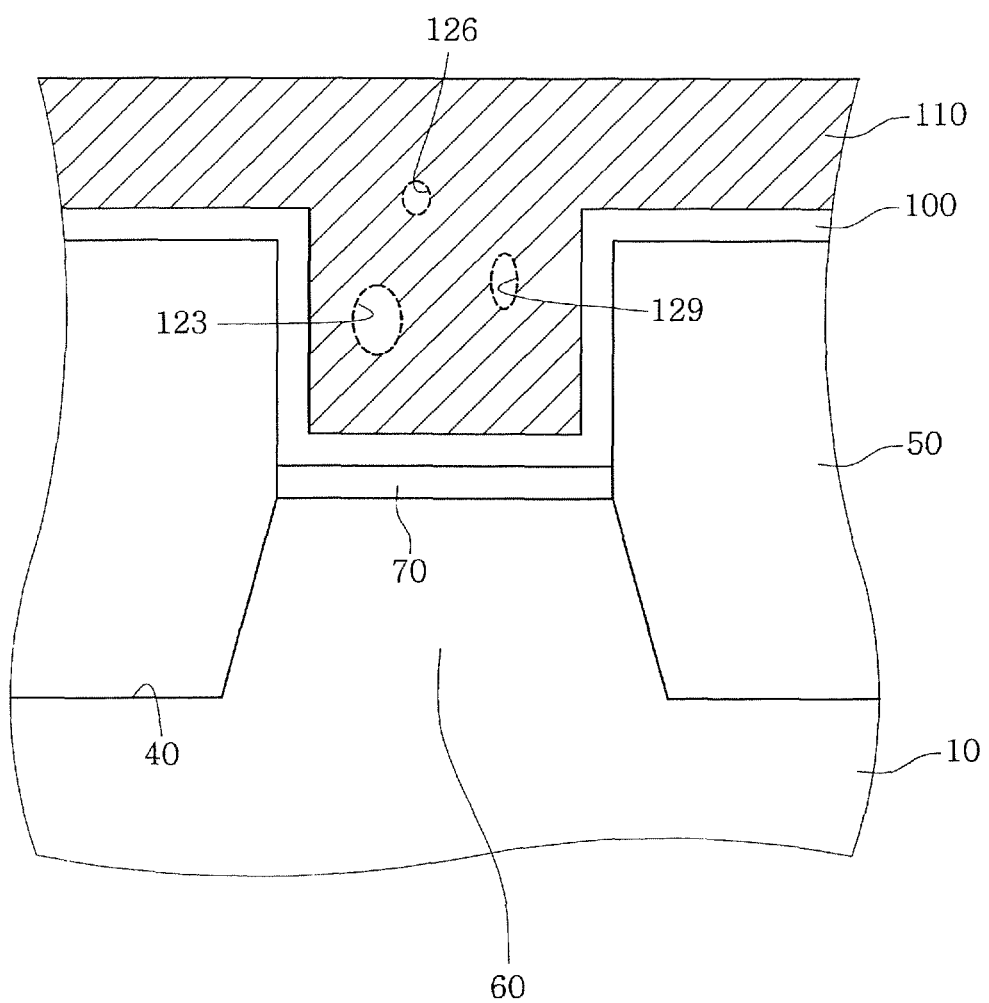
Figure 5:
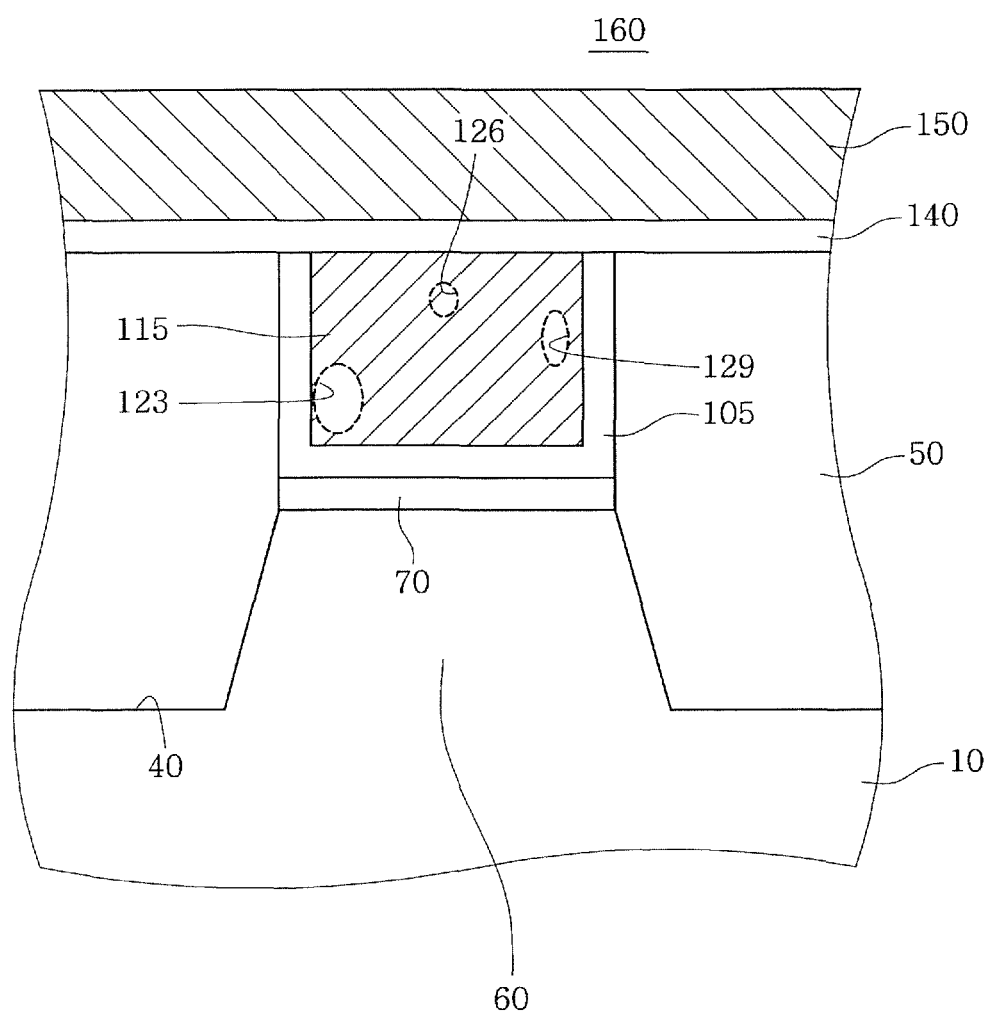
Figure 6:
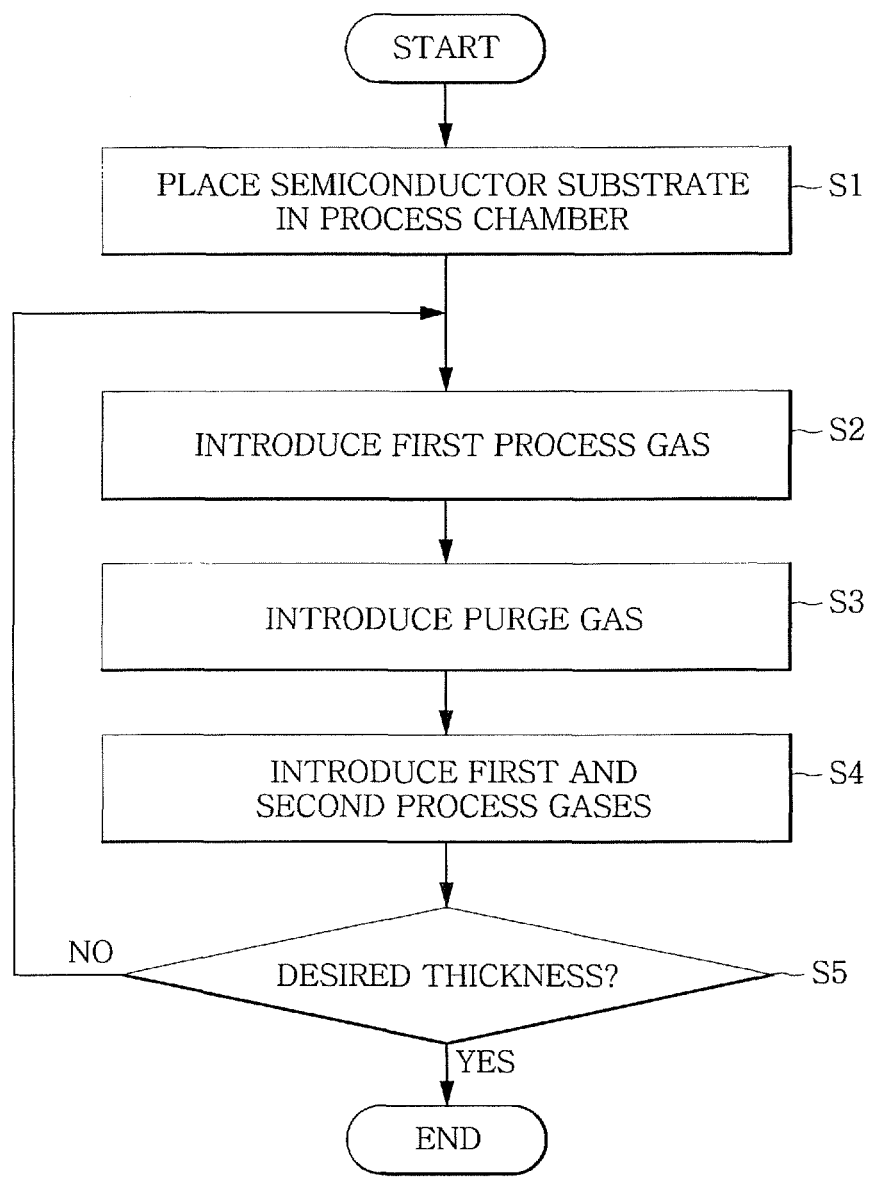
FIG. 6 is a flowchart illustrating a method of forming a diffusion-retarding poly pattern in a non-volatile memory device of FIG. 1.

FIGS. 3 to 5 are cross-sectional views taken along line I-I' of FIG. 1, illustrating a method of fabricating a non-volatile memory device. And, FIG. 6 is a flowchart illustrating a method of forming a diffusion-retarding poly pattern in a non-volatile memory device of FIG. 1.

Figure 7:
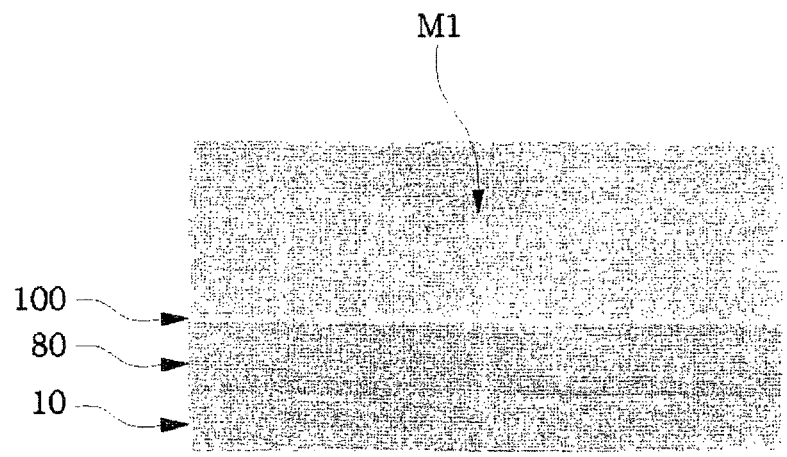
FIG. 7 is a picture showing a surface of a diffusion-retarding poly pattern in a non-volatile memory device of FIG. 1.
Figure 8:
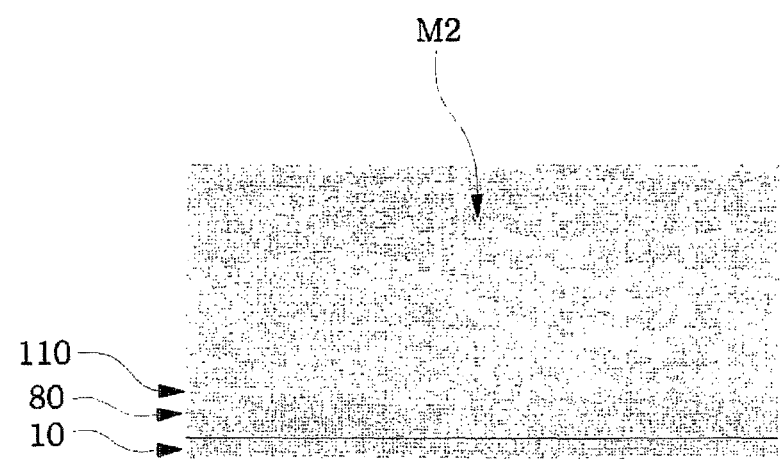
FIG. 8 is a picture showing a surface of a floating gate in a non-volatile memory device of FIG. 1.

FIG. 7 is a picture showing a surface of a diffusion-retarding poly pattern in a non-volatile memory device of FIG. 1, and FIG. 8 is a picture showing a surface of a floating gate in a non-volatile memory device of FIG. 1.

Figure 9:
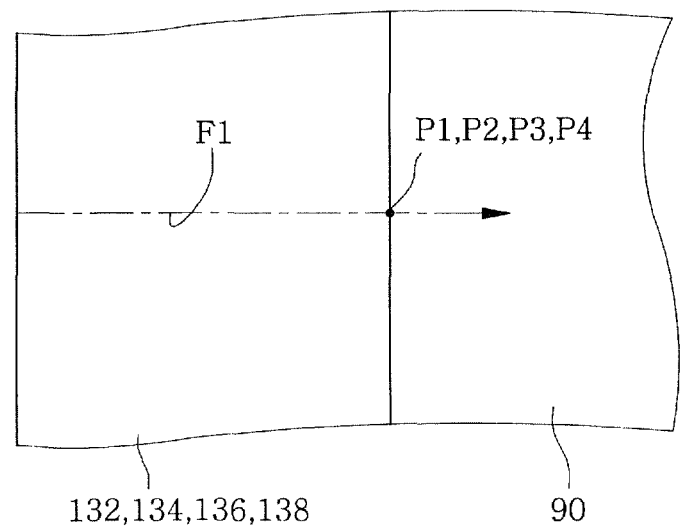
FIG. 9 is a cross-sectional view showing an insulating layer and a diffusion-retarding poly pattern stacked in sequence, and an insulating layer and a floating gate stacked in sequence according to example embodiments.
Figure 10:
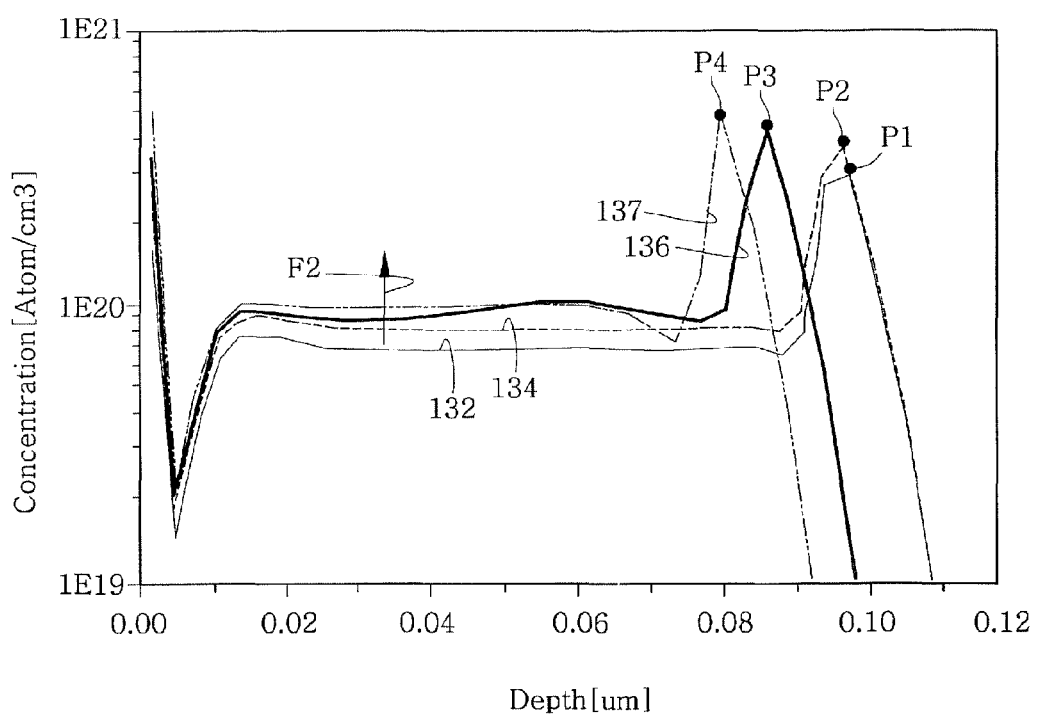
FIG. 10 is a graph showing a concentration of impurity ions in FIG. 9.

FIG. 9 is a cross-sectional view showing an insulating layer and a diffusion-retarding poly pattern stacked in sequence, and an insulating layer and a floating gate stacked in sequence according to example embodiments, and FIG. 10 is a graph showing a concentration of impurity ions in FIG. 9.

Referring to FIG. 3, a pad layer 20 and a mask layer 30 may be formed on a semiconductor substrate 10 according to example embodiments. The pad layer 20 may include silicon oxide. The mask layer 30 may include silicon nitride. Using the pad layer 20 and the mask layer 30 as an etch mask, the semiconductor substrate 10 is etched to form a trench 40 in the semiconductor substrate 10. The trench 40 may be formed to extend downward from a main surface of the semiconductor substrate 10.

As shown in FIG. 1, the trench 40 may define at least one active region 60. An isolation layer 50 may be formed in the trench 40. The isolation layer 50 may be formed to confine the active region 60. To this end, the isolation layer 50 may be formed around the active region 60 to protrude from the upper surface of the active region 60.

Referring to FIG. 4, after the isolation layer 50 is formed, the pad layer 20 and the mask layer 30 may be removed from the semiconductor substrate 10. In this way, the isolation layer 50 and the active region 60 may have a recess interposed therebetween. An insulating layer 70 may be formed on the active region 60. The insulating layer 70 may include silicon oxide, silicon oxynitride, metal oxide, or a combination thereof. A diffusion-retarding poly layer 100 may be formed to a desired thickness on the isolation layer 50 and the insulating layer 70.

The diffusion-retarding poly layer 100 may be formed at a process temperature of 630° C. using a plasma atomic layer deposition technique. In this way, the diffusion-retarding poly layer 100 may be in a crystalline state other than an amorphous state. The diffusion-retarding poly layer 100 may be formed according to the flowchart of FIG. 6. In a first step (S1), the semiconductor substrate 10 having the isolation layer 50 and the insulating layer 70 may be placed in a process chamber (not shown). In a second step (S2), a first process gas may be introduced into the process chamber. The first process gas may include $SiH_4$, $SiH_2Cl_2$, or $SiCl_4$.

The first process gas may function as silicon seeds for the diffusion-retarding poly layer 100. In the process chamber, the first process gas may be converted into plasma, and a first reactive material may be deposited on the isolation layer 50 and the insulating layer 70. In a third step (S3), a purge gas may be introduced into the process chamber to remove the first process gas from the process chamber. In a fourth step (S4), the first process gas and a second process gas may be introduced into the process chamber.

The second process gas may include $NH_3$, $N_2O$, $N_2$, or $CH_4$. In the process chamber, the first and second process gases may be converted into plasma, and a second reactive material may be deposited on the isolation layer 50 and the insulating layer 70. The second reactive material may be combined with silicon seeds and constitute a poly layer. The second reactive material may have a flow rate of the second process gas smaller than that of the first process gas. Also, the flow rate of the first process gas of the first reactive material may be smaller than that of the first process gas of the second reactive material.

In a fifth step (S5), the thickness of the poly layer may be compared to a desired thickness for the diffusion-retarding poly layer 100. When the thickness of the poly layer is smaller than the desired thickness, the second to fourth steps may be repeatedly performed to form the diffusion-retarding poly layer 100. When the thickness of the poly layer is substantially the same as the desired thickness, the semiconductor substrate 10 having the poly layer may be unloaded from the process chamber. In this case, the diffusion-retarding poly layer 100 may be conformally formed along the recess.

Meanwhile, a surface of the diffusion-retarding poly layer 100 may be shown in the scanning electron microscope (SEM) picture of FIG. 7. In this case, the diffusion-retarding poly layer 100 was formed on the semiconductor substrate 10 and an insulating layer 80 that are sequentially stacked. The insulating layer 80 was formed to a different thickness from the insulating layer 70 on the semiconductor substrate 10 under the same process condition of FIG. 4. In the SEM picture, the diffusion-retarding poly layer 100 shows a smooth surface M1.

Subsequently, a floating gate layer 110 may be formed on the diffusion-retarding poly layer 100. The floating gate layer 110 may be formed at a process temperature of 620° C. The floating gate layer 110 may include an undoped polysilicon layer. Meanwhile, the surface of the floating gate layer 110 may be shown in the SEM picture of FIG. 8. In this case, the floating gate layer 110 was formed on the semiconductor substrate 10 and the insulating layer 80 that are sequentially stacked as shown in FIG. 7. In the SEM picture, the floating gate layer 110 shows a rough surface M2.

A refractive index (RI) test was conducted on the diffusion-retarding poly layer 100 and the floating gate layer 110. The following results were obtained from the RI test.

| [Comparison of Layer-Specific RIs] | | | |
|---|---|---|---|
| Index | Diffusion-Retarding Poly Layer | Floating Gate Layer | Silicon Nitride Layer |
| Process Temperature (° C.) | 630 | 620 | 630 |
| RI | 3.4 | 4.0 | 1.9 |

Referring to the above table, the diffusion-retarding poly layer 100 has a similar property to the floating gate layer 110 in terms of RI. In other words, the diffusion-retarding poly layer 100 may have the property of polysilicon. Also, the diffusion-retarding poly layer 100 is formed using the second process gas including nitrogen, and thus may have a property of the silicon nitride. As such, the diffusion-retarding poly layer 100 may have the smooth surface M1 as a silicon nitride layer.

On the other hand, the floating gate layer 110 may have the rough surface M2 shown in FIG. 8, and thus may have voids 123, 126 and 129 between the isolation layer 50 and the active region 60 as shown in FIG. 4. This is because process gases and by-product gases may surround the rough surface M2 of the floating gate layer 110, thereby generating the voids 123, 126 and 129, while the floating gate layer 110 is deposited.

Referring back to FIG. 4, P-type impurity ions may be implanted into the floating gate layer 110, and an annealing process may be performed. In the annealing process, the voids 123, 126 and 129 may be moved. The voids 123, 126 and 129 moved adjacent to the diffusion-retarding poly layer 100 cannot pass through the diffusion-retarding poly layer 100. This is because the diffusion-retarding poly layer 100 is in a dense crystalline state similar to a silicon nitride layer. Thus, some of the voids 123, 126 and 129 may contact the diffusion-retarding poly layer 100 while moving on the diffusion-retarding poly layer 100.

Meanwhile, concentrations of impurity ions of the diffusion-retarding poly layer 100 and the floating gate layer 110 were indirectly checked using first to fourth test samples 132, 134, 136 and 138 of FIGS. 9 and 10. The respective first to fourth test samples 132, 134, 136 and 138 were formed on the semiconductor substrate 10 and an insulating layer 90 sequentially stacked as shown in FIG. 9. The first to fourth test samples 132, 134, 136 and 138 have the following process histories:

| [Process Histories of Test Samples] | | | | |
|---|---|---|---|---|
| Index | First Test Sample | Second Test Sample | Third Test Sample | Fourth Test Sample |
| Corresponding Layer in Example Embodiments | Floating Gate Layer | Diffusion-Retarding Poly Layer | Diffusion-Retarding Poly Layer | Diffusion-Retarding Poly Layer |
| Deposition Temperature (° C.) | 620 | 630 | 630 | 630 |
| Whether or not Second Process Gas is Applied | Not Applied | 1 cc of $N_2O$ being Applied | 5 cc of $N_2O$ being Applied | 8 cc of $N_2O$ being Applied |

-continued

[Process Histories of Test Samples]

| Index | First Test Sample | Second Test Sample | Third Test Sample | Fourth Test Sample |
|---|---|---|---|---|
| Whether or not Impurity Ions are Implanted | Boron (B) being Applied | Boron (B) being Applied | Boron (B) being Applied | Boron (B) being Applied |
| Whether or not Annealing Process is Applied | Applied | Applied | Applied | Applied |
| Deposition Thickness (Å) | 1000 | 1000 | 900 | 800 |

The insulating layer 90 was formed to a different thickness from the insulating layer 70 under the same process condition of FIG. 4. The concentrations of the test samples 132, 134, 136 and 138 were measured from the surfaces of the samples 132, 134, 136 and 138 to near a surface of the insulating layer 90 along an arrow F1 using a secondary ion mass spectrometry (SIMS). The concentrations of the first to fourth test samples 132, 134, 136 and 138 measured using the SIMS were denoted in FIG. 10. In FIG. 10, the x-axis denotes measuring depths of the first to fourth test samples 132, 134, 136 and 138 exposed to the SIMS.

And, the y-axis of FIG. 10 denotes concentrations of impurity ions in the bulks of the first to fourth test samples 132, 134, 136 and 138 checked by the SIMS. In FIG. 10, the SIMS made boundaries P1, P2, P3 and P4 between the first to fourth test samples 132, 134, 136 and 138 and the insulating layer 90 respectively correspond to a plurality of concentration peaks. In this case, the first test sample 132 may have a lower boron concentration than the second to fourth test samples 134, 136 and 138 in the bulk. In other words, boron ions in the first test sample 132 may be partially lost to the semiconductor substrate 10 through the insulating layer 90 after an annealing process.

On the other hand, diffusion of boron ions in the second to fourth test samples 134, 136 and 138 may be retarded by nitrogen ions included in the second process gas, and thus the second to fourth test samples 134, 136 and 138 may have higher boron concentrations than the first test sample 132 in the bulks. And, the second to fourth test samples 134, 136 and 138 may have boron concentrations increasing along an arrow F2 with the increase of the flow rate of the second process gas (N$_2$O) in the bulks. When the second process gas includes carbon atoms, it may retard diffusion of boron ions in the bulk of the diffusion-retarding poly layer 100.

In addition, even if the diffusion-retarding poly layer 100 includes chlorine atoms due to the first and second process gases, it may have a higher boron concentration than the first test sample 132 in the bulk.

Referring to FIG. 5, a planarization process is performed on the floating gate layer 110 and the diffusion-retarding poly layer 100 such that the isolation layer 50 can be exposed. The planarization process may be performed to form a preliminary diffusion-retarding poly pattern and a preliminary floating gate stacked in sequence on the recess between the isolation layer 50 and the active region 60. The planarization process may be performed using a chemical-mechanical polishing (CMP) or etch-back technique.

On the isolation layer 50, the oxide layer 140 and a control gate layer (not shown) may be formed in sequence to cover the preliminary floating gate and the preliminary diffusion-retarding poly pattern. The oxide layer 140 may include silicon oxide, silicon oxynitride, metal oxide, or a combination thereof. The control gate layer may have N-type conductivity. By patterning the control gate layer, the oxide layer 140, the preliminary floating gate and the preliminary diffusion-retarding poly pattern, the diffusion-retarding poly pattern 105, the floating gate 115 and the control gate 150 may be formed.

The diffusion-retarding poly pattern 105, the floating gate 115 and the control gate 150 may be formed to expose the isolation layer 50 and the insulating layer 70. The diffusion-retarding poly pattern 105 may be formed to partially surround the floating gate 115 in a predetermined region of the recess between the isolation layer 50 and the active region 60. The floating gate 115 may be the P-type floating gate designated in FIG. 2. The control gate 150 may be formed to overlap the diffusion-retarding poly pattern 105 and the floating gate 115 as shown in FIG. 1. Consequently, the control gate 150 may constitute the non-volatile memory device 160 together with the diffusion-retarding poly pattern 105 and the floating gate 115.

Example embodiments can provide an appropriate means for preventing impurity ions from diffusing from a P-type floating gate to a semiconductor substrate. To this end, example embodiments can include a diffusion-retarding poly pattern under the P-type floating gate. In comparison with conventional art, the diffusion-retarding poly pattern can maintain the P-type floating gate at a desired resistance, thereby improving operating characteristics of a transistor in a non-volatile memory device.

The non-volatile memory device may be a NAND or NOR flash memory device. The diffusion-retarding poly pattern may be formed under an interlayer insulating layer having impurity ions. Also, the diffusion-retarding poly pattern can prevent a material constituting a single material layer, such as a carbon layer, from polluting a neighboring layer. The diffusion-retarding poly pattern can be used for the above-mentioned purpose in volatile memory devices as well as non-volatile memory devices.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A non-volatile memory device, comprising:
   a semiconductor substrate;
   an isolation layer configured to define an active region in the semiconductor substrate and protrude upward from an upper surface of the active region;
   a diffusion-retarding poly pattern conformally disposed in a recess defined by the protrusion of the isolation layer and the upper surface of the active region, and having P-type conductive atoms and barrier atoms retarding diffusion of the P-type conductive atoms; and
   a floating gate on the diffusion-retarding poly pattern, wherein the floating gate includes the P-type conductive atoms.

2. The non-volatile memory device according to claim 1, wherein the barrier atoms include nitrogen (N), chlorine (Cl), or carbon (C).

3. The non-volatile memory device according to claim 2, further comprising:
   an insulating layer disposed between the diffusion-retarding poly pattern and the active region,
   wherein the floating gate fills the recess between the isolation layer and the active region,
   wherein the insulating layer includes silicon oxide, silicon oxynitride, metal oxide, or a combination thereof, and the floating gate is exposed through the diffusion-retarding poly pattern along the active region.

4. The non-volatile memory device according to claim 3, further comprising:
   an oxide layer disposed on the floating gate, the diffusion-retarding poly pattern and the isolation layer; and
   a control gate disposed on the oxide layer,
   wherein the control gate has N-type conductivity, and the oxide layer includes silicon oxide, silicon oxynitride, metal oxide, or a combination thereof.

5. The non-volatile memory device according to claim 1, wherein:
   the diffusion-retarding poly pattern comprises a polysilicon diffusion-retarding poly pattern; and
   the floating gate comprises a polysilicon floating gate that is directly on the polysilicon diffusion-retarding poly pattern to fill the recess.

6. The non-volatile memory device according to claim 5, wherein the polysilicon diffusion-retarding poly pattern is directly on a plurality of sides of the polysilicon floating gate.

7. A non-volatile memory device, comprising:
   a semiconductor substrate;
   an isolation layer configured to define an active region in the semiconductor substrate;
   an insulating layer on the active region;
   a polysilicon pattern directly on the insulating layer, wherein the polysilicon pattern includes boron atoms and nitrogen atoms retarding diffusion of the boron atoms;
   a floating gate directly on the polysilicon pattern, wherein the floating gate includes boron atoms;
   an oxide layer on the floating gate; and
   a control gate on the oxide layer.

8. A non-volatile memory device, comprising:
   a semiconductor substrate;
   an isolation layer configured to define an active region in the semiconductor substrate;
   an insulating layer on the active region;
   a polysilicon pattern directly on the insulating layer, wherein the polysilicon pattern includes boron atoms and at least one of carbon atoms and chlorine atoms retarding diffusion of the boron atoms;
   a floating gate directly on the polysilicon pattern, wherein the floating gate includes boron atoms;
   an oxide layer on the floating gate; and
   a control gate on the oxide layer.

9. The non-volatile memory device of claim 8, wherein the isolation layer extends along a sidewall of the polysilicon pattern toward a surface of the oxide layer.

* * * * *